United States Patent [19]

Miyajima et al.

[11] Patent Number: 5,223,446
[45] Date of Patent: Jun. 29, 1993

[54] SEMICONDUCTOR DEVICE WITH A PHOTODETECTOR SWITCHING DEVICE GROWN ON A RECRYSTALLIZED MONOCRYSTAL SILICON FILM

[75] Inventors: Toshiaki Miyajima; Shinji Toyoyama; Masayoshi Koba, all of Nara, Japan

[73] Assignee: Sharp Kabushiki Kaisha, Osaka, Japan

[21] Appl. No.: 777,668

[22] Filed: Oct. 16, 1991

Related U.S. Application Data

[63] Continuation of Ser. No. 443,278, Nov. 28, 1989, Pat. No. 5,105,090.

[30] Foreign Application Priority Data

Nov. 30, 1988 [JP] Japan ................................ 63-304822

[51] Int. Cl.$^5$ .......................................... H01L 21/335
[52] U.S. Cl. ........................................ 437/40; 437/59; 437/84; 437/915
[58] Field of Search ............ 250/551, 214 R, 214 SW; 307/311, 570, 574, 575, 580, 584; 437/21, 40, 59, 60, 904, 915, 84; 357/30

[56] References Cited

U.S. PATENT DOCUMENTS 3,448,344 6/1969 Schuster et al. .................. 357/30 H
4,390,790 6/1983 Rodriguez et al. .
4,916,323 4/1990 Hayashi et al. ..................... 250/551

FOREIGN PATENT DOCUMENTS 54-6461 1/1979 Japan .................................. 437/201
62-106660 5/1987 Japan .
63-283081 11/1988 Japan .

OTHER PUBLICATIONS

Kioi, K., et al., "SOI Photodiode Array Stacked on VDMOS . . . ", IEEE IEDM Tech. Dig., 1987, pp. 460-463.

Primary Examiner—T. N. Quach
Attorney, Agent, or Firm—Morrison & Foerster

[57] ABSTRACT

A semiconductor device is disclosed which comprises a normally-off first MOSFET, a normally-off second MOSFET connected between the gate and source of the first MOSFET, a diode connected between the gate and source of the second MOSFET, a resistor and an optoelectric transducer array, both of which are connected in parallel with each other between the gate and drain of the second MOSFET, wherein all of the components are formed on a single semiconductor chip. Also disclosed is a semiconductor device comprising a normally-off first MOSFET, a normally-on second MOSFET connected between the gate and source of the first MOSFET, a first resistor and a diode, both of which are connected in series between the source and drain of the second MOSFET, a second resistor connected between the gate and source of the second MOSFET, an optoelectric transducer array connected between the gate of the second MOSFET and the terminal which is positioned between the first resistor and the diode, wherein all of the components are formed on a single semiconductor chip.

Further disclosed is a method for manufacturing a semiconductor device comprising a normally-off first MOSFET, a normally-off second MOSFET connected between the gate and source of the first MOSFET, a diode connected between the gate and source of the second MOSFET, a resistor and an optoelectric transducer array, both of which are connected in parallel with each other between the gate and drain of the second MOSFET.

3 Claims, 7 Drawing Sheets

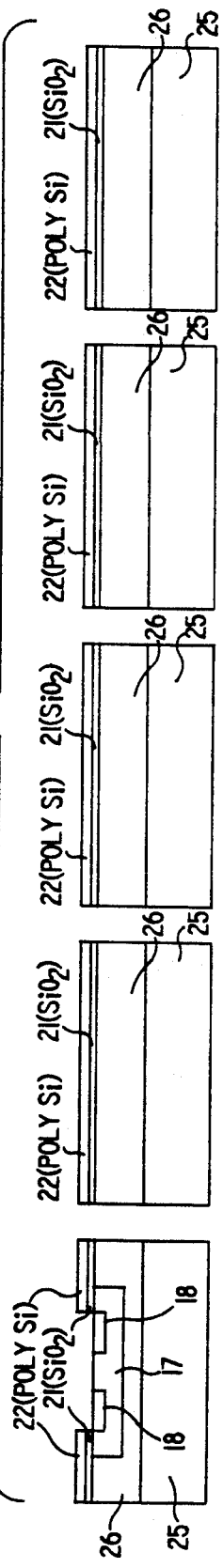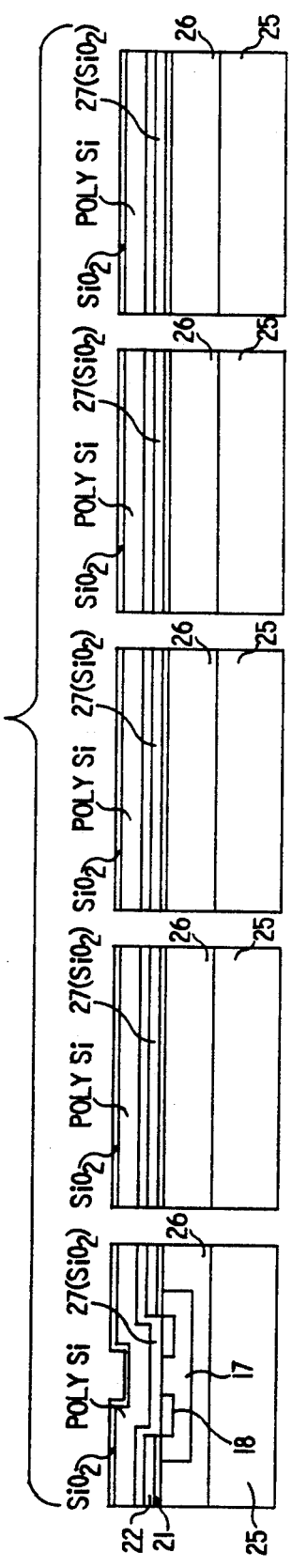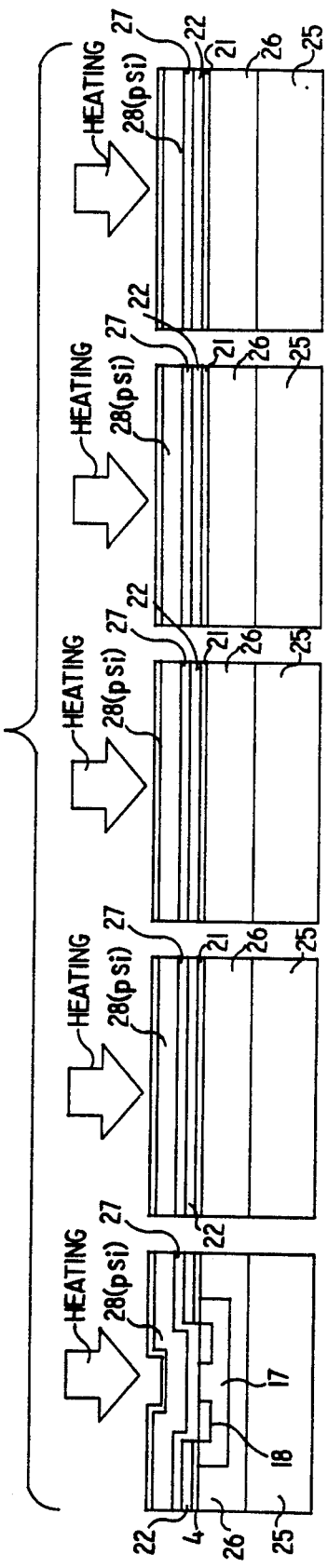

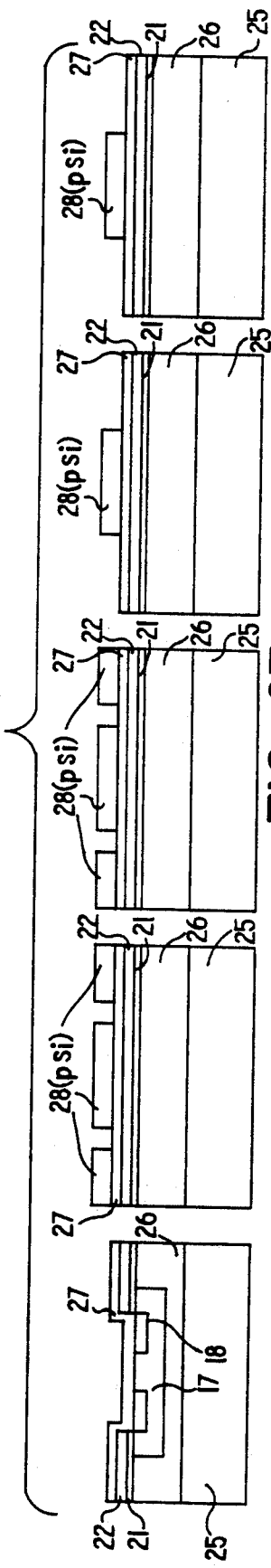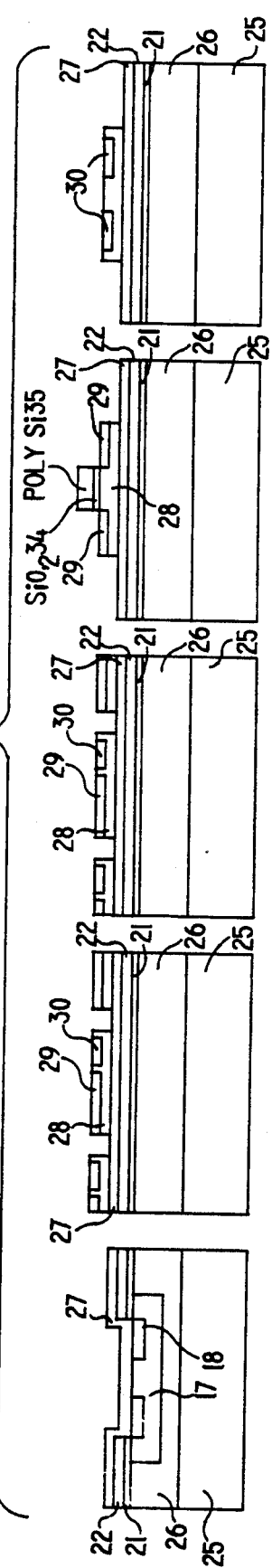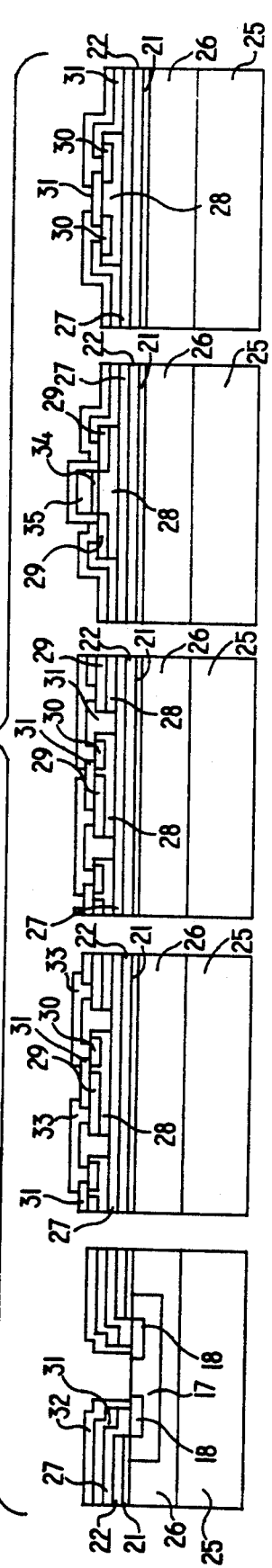

SEMICONDUCTOR DEVICE WITH A PHOTODETECTOR SWITCHING DEVICE GROWN ON A RECRYSTALLIZED MONOCRYSTAL SILICON FILM

This application is a continuation of application Ser. No. 443,278 filed Nov. 28, 1989, now U.S. Pat. No. 5,105,090.

BACKGROUND OF THE INVENTION

1. Field of the Invention

The present invention relates to a semi-conductor device which constitutes the photodetector part of a switching device used in combination with a light-emitting diode (LED).

2. Description of the Prior Art

In recent years, with the achievement of rapid development in semiconductor technology, there have been increased demands for higher performances and miniaturization of hardware in various control systems, along with digitalization thereof. However, the input/output parts of these control systems still process analog signals, and when viewed from the whole system, digital circuits and analog circuits are arranged in a mixed form within the same system. Accordingly, it is an important subject that analog signals (particularly, minute voltages and currents) are reliably processed and that the processed signals are introduced into the control part of the system.

As a device for controlling an output-side circuit insulated electrically from an input-side circuit according to the signals given to the input-side circuit, electromagnetic relays have been mainly used. However, electromagnetic relays have movable mechanical parts; therefore the relay itself is large in size, and it is difficult to make the equipment using this relay smaller in size. Moreover, electromagnetic relays have disadvantages in that the movable mechanical parts are easily fatigued and the life time thereof is short.

In place of such electromagnetic relays, semiconductor relays, referred to as solid state relays (SSRs), having the advantages of small size, light weight, and a long life time have been widely applied. For example, an optically coupled semiconductor relay has been developed, which is composed of a light emitting part, comprising a light emitting diode, and a photodetector part, comprising a photodiode array and a metal-oxide semiconductor field effect transistor (MOSFET).

As a switching device of this kind, there is used, for example, an optically coupled semiconductor relay such as shown in FIG. 5. In such an optically semiconductor relay, light emitted from a forward-biased LED 40 is received by a photodiode array 41 which produces a voltage higher than the threshold voltage when exposed to light radiation, the produced voltage is applied to the gate G of a normally-off n-channel MOSFET 42 to cause conduction to take place between the drain D and source S thereof, and the positive charge stored at the gate G of the MOSFET 42 is released through the photodiode array 41 which loses the photoelectromotive force upon the darkening of the LED, to cut off conduction between the drain D and source S.

However, the release of the positive charge through the photodiode array 41, as mentioned above, takes considerable time because of the large resistance of the array, resulting in a longer fall time when switching off the MOSFET 42, and hence, a drop in the switching characteristics. For improvement, a technique may be considered in which the positive charge is released through a low-resistance resistor 43 inserted in parallel with the photodiode array 41, as shown by a dotted line in FIG. 5. This, however, will in turn cause the problem that the photoelectromotive force generated in the photodiode array 41 by the illumination from the LED becomes shorted, which prevents the gate G voltage of the MOSFET 42 from reaching the threshold value, thus resulting in insufficient conduction.

To solve the above problem, a technique has previously been proposed in which a discharging MOSFET is used, as shown in FIGS. 6 and 7. In the circuit shown in FIG. 6, a normally-on n-channel MOSFET 44 is connected between the gate G and source S of the switching MOSFET 42, while between the gate G and drain D of the MOSFET 44, a resistor 45 and an additional photodiode array 46 in the reverse direction are connected in parallel with each other. When the MOSFET 42 remains conducting by the action of the photodiode array 41 exposed to light radiation from the LED 40, the photodiode array 46 applies a voltage higher than the negative threshold voltage to the gate G of the discharging MOSFET 44 to cut off conduction between the source S and drain D thereof. On the other hand, when the LED 40 goes off, the positive charge stored at the gate G of the MOSFET 42 is rapidly released through the discharging MOSFET 44 which conducts upon the extinction of the electromotive force in the photodiode array 41, thus quickly putting the switching MOSFET 42 into the nonconducting state.

On the other hand, in the circuit shown in FIG. 7, a normally-on p-channel MOSFET 47 is connected between the gate G and source S of the MOSFET 42, while a resistor 48 is connected between the gate G and drain D of the MOSFET 47, and a diode 49 in the forward direction is connected between the gate G and source S thereof. When the MOSFET 42 remains conducting by the photoelectromotive force of the photodiode array 41, the MOSFET 47 to the gate G of which a positive voltage is applied by the photoelectromotive force is put in the nonconducting state, and the positive charge stored at the gate G of the MOSFET 42 is rapidly released through the discharging MOSFET 47 which conducts upon the extinction of the photoelectromotive force of the photodiode array 41, thus quickly putting the switching MOSFET 42 into the nonconducting state.

However, the circuit shown in FIG. 6 has the disadvantages of increasing the size and cost of the optically coupled semiconductor relay because it requires the additional photodiode array 46 connected in the reverse direction between the gate G and drain D of the normally-on n-channel discharging MOSFET 44 in order to operate the MOSFET 44 in reverse to the normally-off n-channel switching MOSFET 42. Also, it is usual to form the photodiode array and the discharging MOSFET, and sometimes, the switching MOSFET also, on a single chip for compactness in size. In such a case, since both MOSFETs 42 and 44 in the circuit of FIG. 6 are n-channel devices with n-type source and drain regions formed in a p-type substrate, there will be no problem if the photodiode array 41 is formed on the p-type substrate with a n-type photodetector layer deposited thereon. On the other hand, in the case of the circuit of FIG. 7 which uses the MOSFETs 42 and 47 of different channel types from each other, the former being n-type and the latter p-type, if the photodiode array 41 is formed in the same type as in FIG. 6, there will be no need for an additional photodiode array because it has the reverse construction to that of the p-channel MOSFET 47 having its p-type source and drain formed in a n-type substrate, but this circuit construction has the disadvantage in that it involves increased numbers of processes and masks used during the manufacture of the semiconductor chip.

SUMMARY OF THE INVENTION

A semiconductor device of this invention, which overcomes the above-discussed and numerous other disadvantages and deficiencies of the prior art, comprises a normally-off first MOSFET, a normally-off second MOSFET connected between the gate and source of the first MOSFET, a diode connected between the gate and source of the second MOSFET, a resistor and an optoelectric transducer array, both of which are connected in parallel with each other between the gate and drain of the second MOSFET, wherein all of the components are formed on a single semiconductor chip.

In a preferred embodiment, the first and second MOSFETs are of the n-channel type.

In a preferred embodiment, the optoelectric transducer array is a photodiode array.

In a preferred embodiment, the diode connected between the gate and drain of the second MOSFET is in the reverse direction with respect to the optoelectric transducer array.

In a preferred embodiment, the first MOSFET is formed in a vertical shape with the semiconductor chip used as the drain of the first MOSFET.

In a preferred embodiment, the positive threshold voltage for the second MOSFET is set at a smaller value than that for the first MOSFET.

Another semiconductor device of this invention, which overcomes the above-discussed and numerous other disadvantages and deficiencies of the prior art, comprises a normally-off first MOSFET, a normally-on second MOSFET connected between the gate and source of the first MOSFET, a first resistor and a diode, both of which are connected in series between the source and drain of the second MOSFET, a second resistor connected between the gate and source of the second MOSFET, an optoelectric transducer array connected between the gate of the second MOSFET and the terminal which is positioned between the first resistor and the diode, wherein all of the components are formed on a single semiconductor chip.

In a preferred embodiment, the first and second MOSFETs are of the n-channel type.

In a preferred embodiment, the optoelectric transducer array is a photodiode array.

In a preferred embodiment, the diode connected in series with the first resistor is in the reverse direction with respect to the optoelectric transducer array.

In a preferred embodiment, the first MOSFET is formed in a vertical shape with the semiconductor chip used as the drain of the first MOSFET.

Thus, the invention described herein makes possible the objectives of (1) providing a semiconductor device which is capable of being formed on a single chip using a single optoelectric transducer array in a reduced number of processes and at reduced costs and which is capable of improving switching characteristics with a shorter fall time at the time of switching off, by improving a circuit comprising an optoelectric transducer array and a discharging MOSFET used to release the gate charge of a switching MOSFET, as well as the channel types of these devices; and (2) providing a semiconductor device in which there are formed on one chip, an optoelectric transducer which generates a photoelectromotive force to apply a voltage higher than the threshold voltage to the gate of a normally-off n-channel MOSFET for switching use, a normally-off or normally-on n-channel MOSFET which operates in reverse to the switching MOSFET to rapidly release the positive charge stored in the gate thereof upon the extinction of the photoelectromotive force of the optoelectric transducer, and resistors and diode connected between the above components, so that the fall time at the time of switching off can be drastically shortened to improve the switching characteristics significantly and the photodetector part including the fall time reducing circuit but excluding the switching MOSFET can be easily and inexpensively formed on one chip for compactness in size, which further leads to the reduction of size and cost of the whole semiconductor device.

BRIEF DESCRIPTION OF THE DRAWINGS

This invention may be better understood and its numerous objects and advantages will become apparent to those skilled in the art by reference to the accompanying drawings as follows:

FIGS. 8(a) thru 8(f) are illustrations showing the production steps of the semiconductor relay as they relate to the circuit elements of the device.

Figure 1:
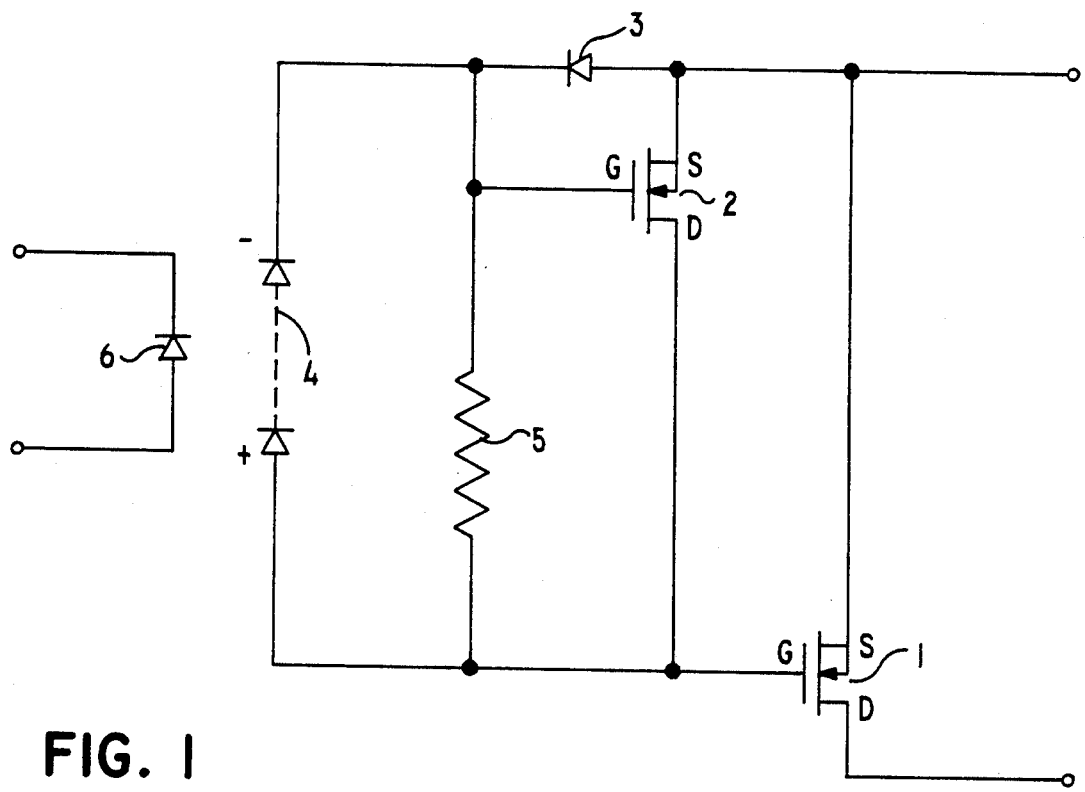
FIG. 1 is a circuit diagram of an optically coupled semiconductor relay as a first semiconductor device of the present invention.

In the first semiconductor device of the present invention, let us assume that the first and second MOSFETs are connected to each other. The optoelectric transducer array generates a photoelectromotive force when exposed to light radiation, the photoelectromotive force causing a voltage higher than the threshold voltage to be applied to the gate of the normally-off n-channel first MOSFET which is thus made to conduct. On the other hand, since a negative voltage is applied to the normally-off n-channel second MOSFET, the second MOSFET remains nonconducting, and therefore, the positive voltage applied to the gate of the first MOSFET is maintained, producing an "on" output signal between the drain and source of the first MOSFET. When the light radiation to the optoelectric transducer array stops, the photoelectromotive force will go off, causing part of the positive charge stored at the gate of the first MOSFET to flow through the resistor into the gate of the second MOSFET which is thus made to conduct. Then, the positive charge stored at the gate of the first MOSFET is rapidly released through the drain and source of the second MOSFET, putting the first MOSFET in the nonconducting state and producing an "off" output signal between the drain and source of the first MOSFET.

In the second semiconductor device of the present invention, let us assume that the normally-off and normally-on MOSFETs are connected to each other. The optoelectric transducer array generates a photoelectromotive force when exposed to light radiation, the photoelectromotive force causing, via the diode, the normally-off n-channel MOSFET to conduct in the same manner as described above. On the other hand, the normally-on n-channel MOSFET to the gate of which a negative voltage is applied is put in the nonconducting state, and therefore, the positive voltage applied to the gate of the normally-off MOSFET is maintained, producing an "on" output signal between the source and drain of the normally-off MOSFET. When the light radiation to the optoelectric transducer array stops, the photoelectromotive force will go off, causing the negative charge stored at the gate of the normally-on MOSFET to flow via the second resistor to the source thereof to put the MOSFET into its original conducting state. Then, the positive charge stored at the gate of the normally-off MOSFET is rapidly released through the drain and source of the normally-on MOSFET, putting the normally-off MOSFET in the nonconducting state and producing an "off" output signal between the source and drain of the MOSFET.

As described above, in both the first and second semiconductor devices of the present invention, since only one optoelectric transducer array is used, and since the two MOSFETs are both n-channel type, the semiconductor device can be formed on a single chip in reduced numbers of processes and masks, with ease, and at low cost, if the photodiode array used for the optoelectric transducer array is formed in the same n-type, and the fall time at the time of switching off the first or normally-off MOSFET can be drastically shortened.

The present invention will be further explained by reference to the following examples and accompanying drawings.

EXAMPLES

FIG. 1 shows a circuit diagram of an optically coupled semiconductor relay as a first semiconductor device of the present invention. In FIG. 1, reference numeral 1 is a normally-off n-channel first MOSFET for switching use, reference numeral 2 is a normally-off n-channel second MOSFET connected between the gate G and source S of the first MOSFET 1 to release the gate charge thereof, reference numeral 3 is a diode connected in the reverse direction between the gate G and source S of the second MOSFET 2, reference numeral 4 is a photodiode array connected in the reverse direction between the gate G and drain D of the second MOSFET 2, which generates a photoelectromotive force by receiving light emitted from an LED 6, and reference numeral 5 is a resistor connected in parallel with the photodiode array 4.

All the above circuit components, except the LED 6, are formed on one chip by the usual IC fabrication process as described below, for compactness in size. The first MOSFET 1 for switching use is formed in a vertical shape with the substrate of the chip used as its drain in a separate portion of the chip from the portion where the second MOSFET 2 and the photodiode array 4 are formed, because of its large load voltage and load current. Also, since the second MOSFET 2 is required to remain conducting to release the gate charge of the first MOSFET 1 until the first MOSFET 1 is completely cut off, the positive threshold voltage for the second MOSFET 2 is set at a smaller value than that for the first MOSFET 1.

The following will now describe the operation of the optically coupled semiconductor relay of the above construction.

When the forward-biased LED 6 illuminates, a photoelectromotive force having the polarity as shown in FIG. 1 is set up in the photodiode array 4 exposed to the emitted light, the photoelectromotive force causing a voltage higher than the threshold voltage to be applied to the gate G of the normally-off n-channel first MOSFET 1 so that conduction takes place between the drain D and source S of the first MOSFET 1. On the other hand, a negative voltage is applied to the gate G of the normally-off n-channel second MOSFET 2, the second MOSFET 2 thus remaining nonconducting, and therefore, the positive voltage applied to the gate G of the first MOSFET 1 is maintained, producing an "on" output signal between the drain D and source S thereof. Next, when the LED goes off, the photoelectromotive force of the photodiode array 4 also goes off, which causes part of the positive charge stored at the gate G of the first MOSFET 1 to flow via the resistor 5 into the gate G of the second MOSFET 2 to increase the voltage at the gate G thereof above the threshold voltage, the second MOSFET 2 thus being made to conduct. Then, the positive charge stored in the gate G of the first MOSFET 1 is rapidly released through the drain D and source S of the second MOSFET 2, thereby putting the first MOSFET 1 in the nonconducting state and producing an "off" output signal between the drain D and source S of the first MOSFET 1.

Figure 5:
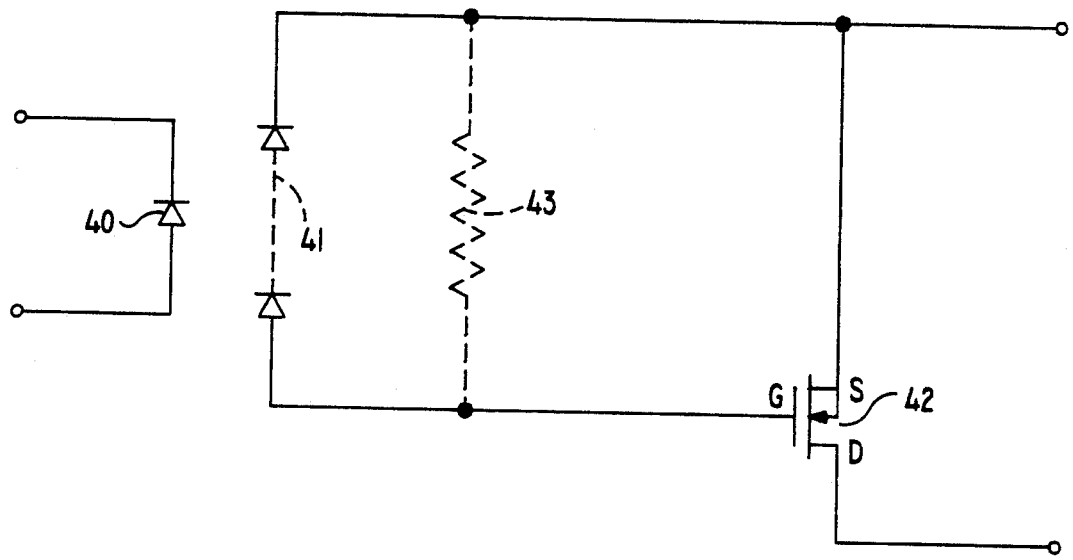
FIGS. 5, 6, and 7 are circuit diagrams of conventional optically coupled semiconductor relays.
Figure 6:
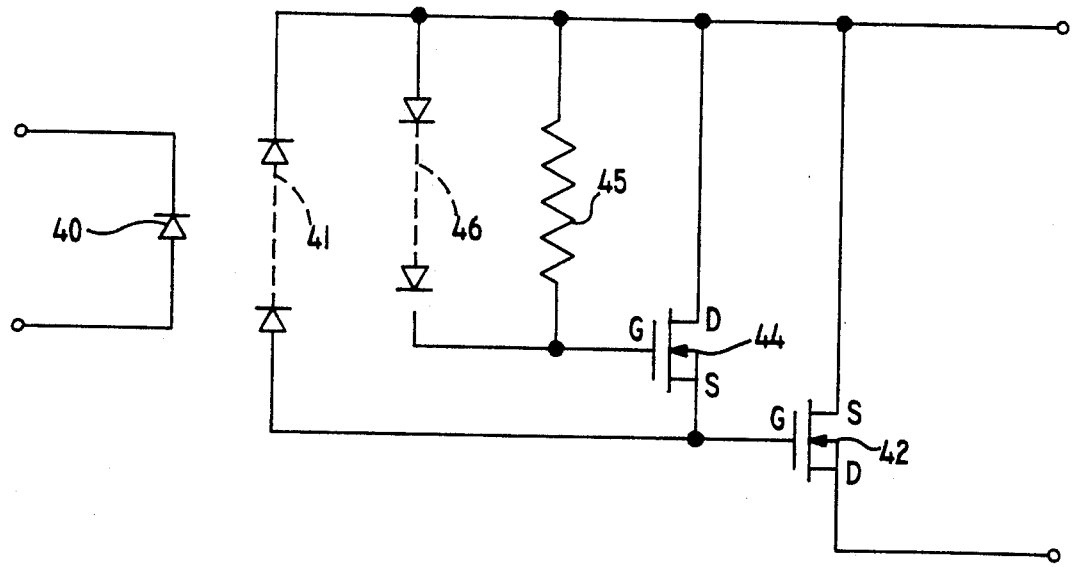
Figure 7:
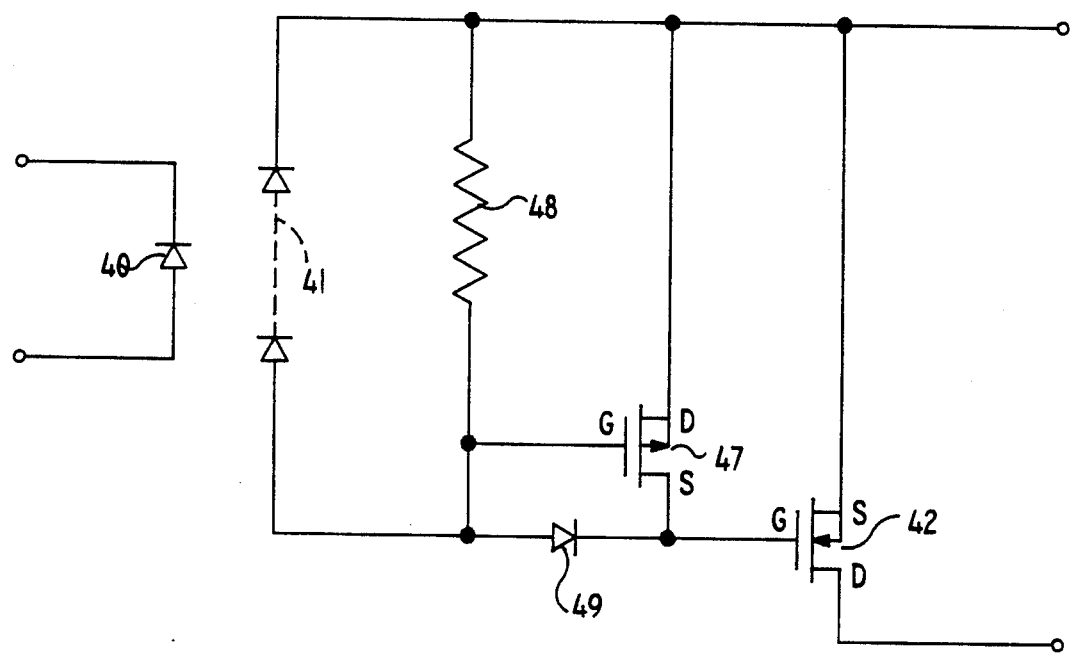

As described above, since the positive charge stored at the gate G of the first switching MOSFET 1 at the time of switching on is rapidly released through the reverse operating second discharging MOSFET 2 at the time of switching off, the fall time of the output signal at the time of switching off is drastically shortened, thus improving the switching characteristics significantly. Also, since making the resistance of the resistor 5 greater does not have any adverse effects on the circuit operation, the gate voltage of the first MOSFET 1 can be rapidly increased above the threshold voltage at the time of switching on, thus providing a faster rising of the output signal at the time of switching on as well as eliminating such problem as mentioned in connection with the prior art of FIG. 5.

Figure 2:
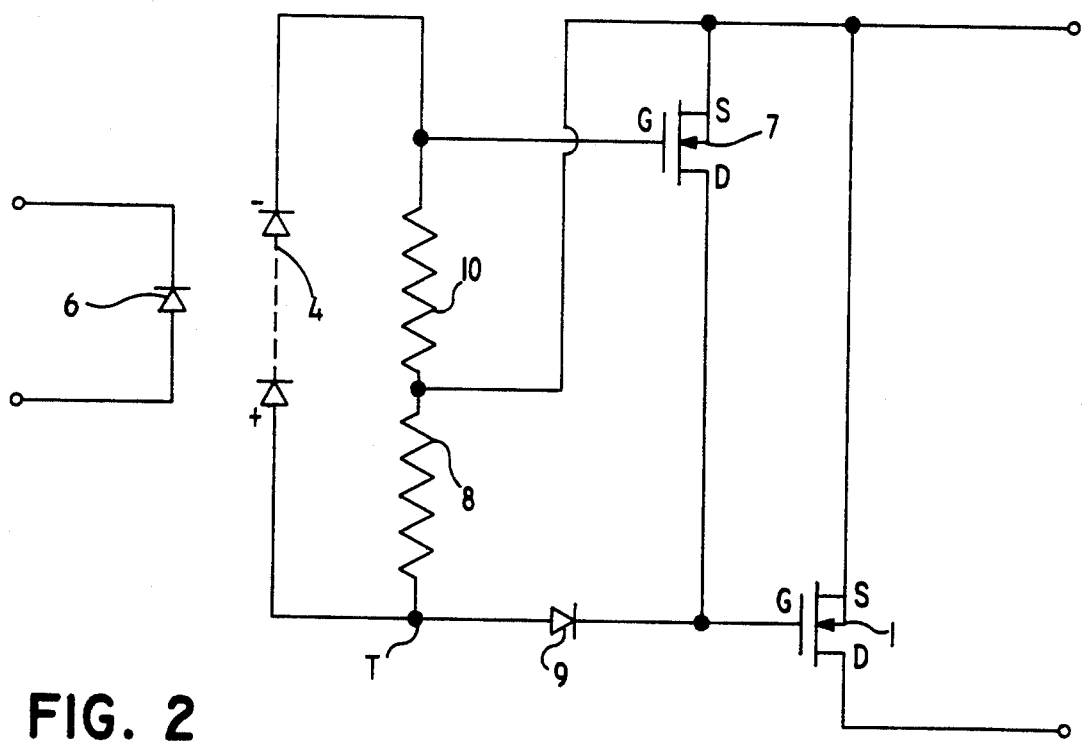
FIG. 2 is a circuit diagram of an optically coupled semiconductor relay as a second semiconductor device of the present invention.

FIG. 2 shows a circuit diagram of an optically coupled semiconductor relay as a second semiconductor device of the present invention. This optically coupled semiconductor relay uses the same normally-off n-channel first MOSFET 1 and LED 6 as shown in FIG. 1, and further comprises a normally-on n-channel second MOSFET 7 connected between the gate G and source S of the first MOSFET 1 to release the gate charge thereof, a first resistor 8 and a forward diode 9 connected in series between the source S and drain D of the second MOSFET 7, a second resistor 10 connected between the gate G and source S thereof, and the same photodiode array 4 as shown in FIG. 1 connected between the gate G of the second MOSFET 7 and a terminal T which is positioned between the first resistor 8 and the diode 9.

All the above circuit components, except the LED 6, are formed on one chip for the same reason as mentioned with reference to FIG. 1. The first MOSFET 1 is formed in a vertical shape in the same manner as previously mentioned. Also, since the second MOSFET 7 is turned off at a voltage higher than the negative threshold voltage opposite in polarity to that for the first MOSFET 1, there is no relationship in terms of the magnitude of the threshold voltage between the first and second MOSFETs 1 and 7, unlike the case of FIG. 1.

The optically coupled semiconductor relay of the above construction operates in the following manner. First, the photodiode array 4 exposed to light radiation from the forward-biased LED 6 generates a photoelectromotive force of the polarity shown in FIG. 2, the electromotive force causing the normally-off n-channel first MOSFET 1, via the diode 9, to conduct. Since, at this time, the normally-on n-channel second MOSFET 7 to the gate G of which a negative voltage is applied is put into the nonconducting state, the positive voltage applied to the gate G of the first MOSFET 1 is maintained, producing an "on" output signal between the drain D and source S of the first MOSFET 1. Next, when the LED 6 goes off, and the photoelectromotive force of the photodiode array 4 therefore goes off, the negative charge stored at the gate G of the second MOSFET 7 flows via the second resistor 10 to the source S thereof, the second MOSFET 7 thus being put into its original conducting state. Then, the positive charge stored at the gate G of the first MOSFET 1 is blocked by the diode 9, and is rapidly released through the drain D and source S of the second MOSFET 7, thus putting the first MOSFET 1 into the nonconducting state and producing an "off" output signal between the drain D and source S thereof.

As described above, since the positive charge stored at the gate G of the first switching MOSFET 1 at the time of switching on is rapidly released through the reverse operating second discharging MOSFET 7 at the time of switching off, the fall time of the output signal at the time of switching off is drastically shortened, thus improving the switching characteristics significantly. It should be appreciated that it is also possible to provide a faster rising of the output signal at the time of switching on by making the resistance values of the first and second resistors 8 and 10 greater.

Referring to FIGS. 3a to 3d and 4, the following will now describe a method of forming the circuit components, except the LED 6, of the optically coupled semiconductor relays described in FIGS. 1 and 2, on one chip by an IC fabrication process. The following deals with the semiconductor device shown in FIG. 1 because the semiconductor device of FIG. 2 is formed in the same manner as that of FIG. 1.

Figure 3A:
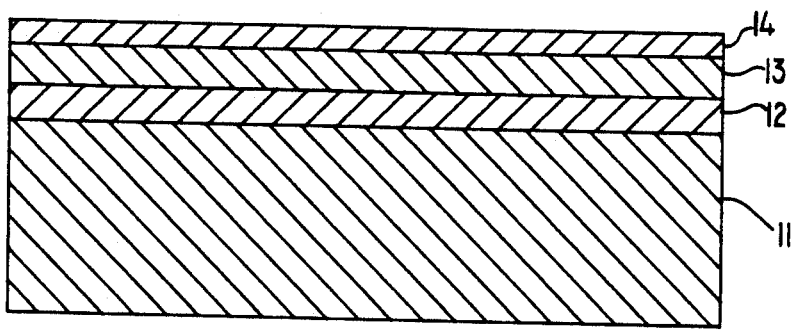
FIGS. 3a to 3d are sectional views showing the production of the optically coupled semiconductor relays mentioned above.
Figure 3B:
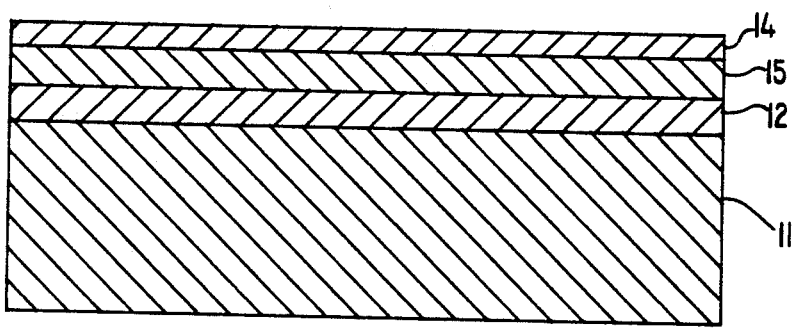
Figure 3C:
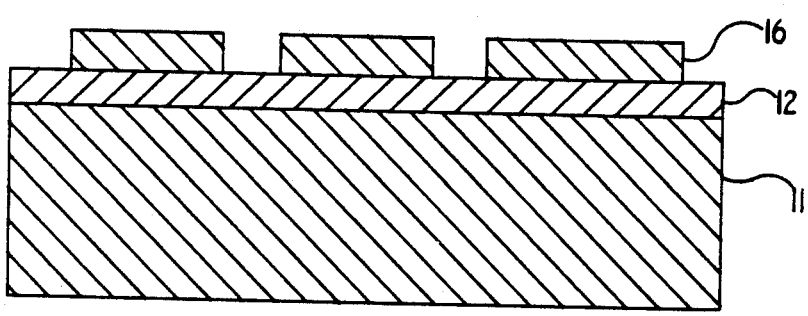
Figure 3D:
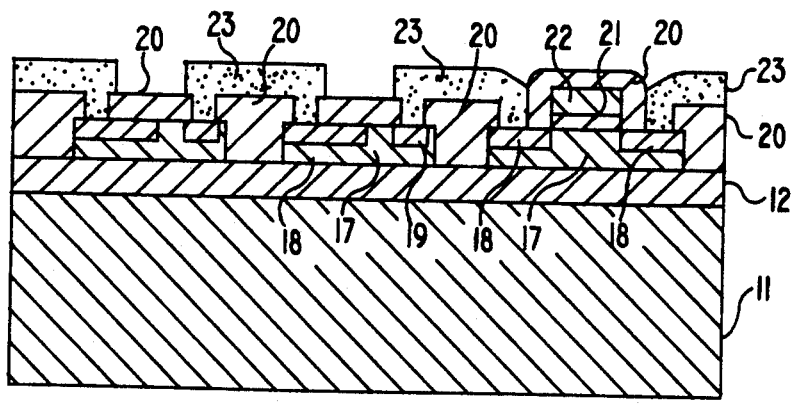

FIGS. 3a to 3d show the formation of the circuit components other than the first MOSFET 1 on one chip. First, as shown in FIG. 3a, a silicon substrate 11 is subjected to thermal oxidation to form on its surface a silicon oxide film 12, on top of which a polycrystal silicon film 13 and a silicon oxide film 14 are then formed by chemical vapor deposition under reduced pressure. Next, as shown in FIG. 3b, the polycrystal silicon film 13 is heated by the radiation of a laser or electron beam or by the use of a lamp or heater, so that the polycrystal silicon film 13 is melted, recrystallized, and changed into a monocrystal silicon film 15. After removing the silicon oxide film 14 on the surface, the monocrystal silicon film 15 is formed by means of lithography into islands of monocrystal silicon film 16, as shown in FIG. 3c. Finally, as shown in FIG. 3d, a p-type monocrystal silicon region 17, an n+-type monocrystal silicon region 18, and a p+-type monocrystal silicon region 19 are formed in each island of the monocrystal silicon film 16. Then, a silicon oxide film 20, a gate silicon oxide film 21, a gate polycrystal silicon film 22, an aluminum electrode 23, etc. are formed to complete the photodiode array 4, the second MOSFET 2, the diode 3 and the resistor 5 shown in FIG. 1.

The photodetector part of the optically coupled semiconductor relay, including the aforementioned fall time reducing circuit but excluding the LED 6 which is the light emitting part and the first MOSFET 1 which is the switching part, is thus formed on one chip, reducing the size of the photodetector part and hence the size of the optically coupled semiconductor relay. Needless to say, in an application which does not require compactness in size, these circuit components can be fabricated using individual parts.

Figure 4:
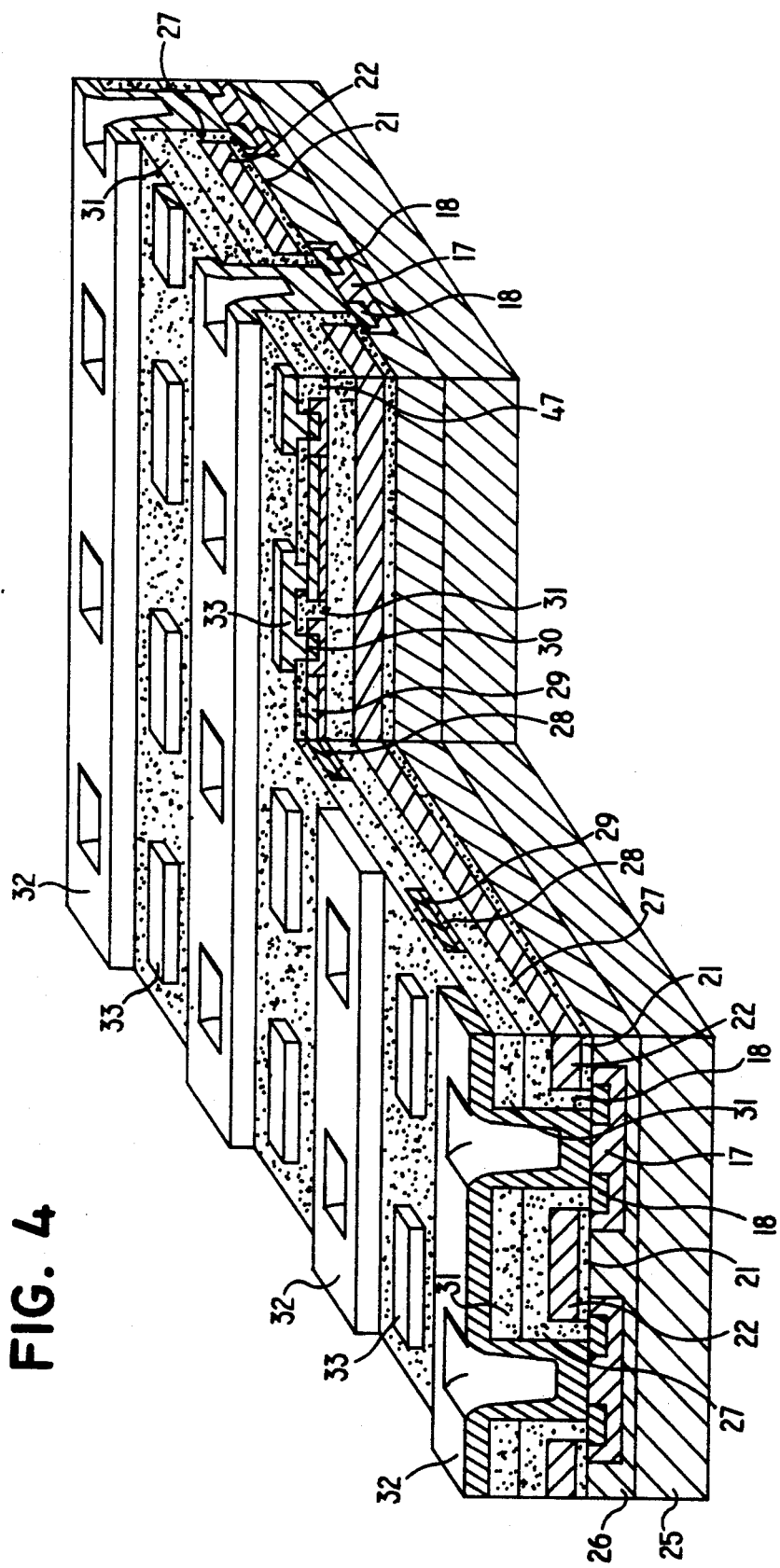
FIG. 4 is a partially cutaway fragmentary perspective view of the optically coupled semiconductor relays mentioned above.

FIG. 4 is a partially cutaway fragmentary perspective view, of the same semiconductor chip as shown in FIGS. 3a to 3d except that the first MOSFET 1 is formed in a vertical shape in the chip for further compactness in size. To produce this semiconductor chip, an n-type monocrystal silicon epitaxial layer 26 is first formed on the surface of an n+-type monocrystal silicon substrate 25, and wells are made in the layer 26, in each of which the same p-type monocrystal silicon region 17, n+-type monocrystal silicon region 18, gate silicon oxide film 21, and gate polycrystal silicon film 22 as shown in FIG. 3d are formed to form the important part of the first MOSFET 1 in a vertical shape. Next, a silicon oxide film 27, a polycrystal silicon film, and a silicon oxide film are successively formed over the entire surface, which is then heated in the same manner as shown in FIGS. 3b and 3c to change the polycrystal silicon film into a p-type monocrystal silicon film 28. The p-type monocrystal silicon film 28 is then patterned to form islands of monocrystal silicon in each of which an n+-type monocrystal silicon region 29 and a p+-type monocrystal silicon region 30 are formed in the same manner as shown in FIG. 3d, and further, a silicon oxide film 31, aluminum electrodes 32 and 33 for the first MOSFET 1 and other parts, etc. are formed to complete the photodiode array 4, the second MOSFET 2, the diode 3, and the resistor 5 as shown in FIG. 1. Heating of forming the monocrystal silicon film 28 should be accomplished by radiation of a laser or electron beam to protect the first MOSFET 1 formed in the lower layer from thermal damage.

FIGS. 8a thru 8f are detailed illustrations of the semiconductor relay device in the various production steps described above as they relate to the circuit elements photodiode array 4, diode 3, MOSFET 2 and resistor 5. The method of interconnecting the elements of the semiconductor relay is described with reference to FIG. 4.

The switching part and photodetector part of the optically coupled semiconductor relay, including the aforementioned fall time reducing circuit but excluding the LED 6 which is the light emitting part, are thus formed on one chip, the first and second MOSFETs 1 and 2, which are the major devices, and the photodiode array 4 all being n-type having the same polarity. With this construction, it is possible to further reduce the size of the photodetector part and hence the size of the optically coupled semiconductor relay as compared with the foregoing example, as well as to manufacture them with reduced numbers of masks and processes, with ease, and at low cost, thus offering remarkable advantages.

In the example of FIG. 4, the first MOSFET 1 for switching use is formed in a vertical shape with the substrate used as its drain, on top of which other components including the second MOSFET 2 for discharging use are formed, but if the load voltage and load current of the first MOSFET 1 are small, the first MOSFET 1 can be formed in the same island of monocrystal silicon film that contains the second MOSFET 2 and other components. It is also possible to form only the first MOSFET 1 on a separate chip and other components including the second MOSFET 2 on one chip. It should also be appreciated that the present invention is not limited to the examples shown in the accompanying drawings.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for manufacturing a semiconductor device, said semiconductor device comprising a normally-off n-channel first MOSFET and a normally-off n-channel second MOSFET, wherein each of the first and second MOSFETs includes a gate, a source and a drain and the second MOSFET is connected between the gate and source of said first MOSFET, the semiconductor device further comprising a diode connected between the gate and source of the second MOSFET, a resistor and an optoelectric transducer array, both of which are connected in parallel with each other between the gate and drain of said second MOSFET, wherein all of said first and second MOSFETs, said diode, said resistor, and said optoelectric transducer array are formed on a single semiconductor chip, said second MOSFET, said diode, said resistor, and said optoelectric transducer array being formed on a recrystallized monocrystal silicon film, and wherein the positive threshold voltage for said second MOSFET is set at a smaller value than that for said first MOSFET, said method comprising the steps of (i) providing an n+-type monocrystal silicon substrate (25), (ii) forming an n-type monocrystal silicon epitaxial layer (26) on said substrate, (iii) providing a plurality of wells in said epitaxial layer (26), (iv) forming in each of said wells p-type monocrystal primary silicon regions (17), (v) forming in said p-type monocrystal primary silicon regions (17) n+-type monocrystal secondary regions (18), (vi) depositing a gate silicon oxide film (21) on said n-type monocrystal silicon epitaxial layer (26), and depositing a gate polycrystal silicon film (22) on said gate silicon oxide film (21), (vii) removing portions of said silicon oxide film (21) and said polycrystal silicon film (22), which cover said p-type monocrystal primary silicon regions (17), from each one edge to the other edge of said n+-type monocrystal of said secondary regions (18), (viii) growing in sequence a silicon oxide film (27), a polycrystal silicon film (28(p Si)) and a silicon oxide film over the entire surface of the device, (ix) heating said polycrystal silicon film (28(p Si)) so that said polycrystal silicon film (28(p Si)) is melted, recrystallized, and changed into a p-type monocrystal silicon film (28), (x) patterning said p-type monocrystal silicon (28) to form islands, (xi) forming in each of said islands an n+-type monocrystal silicon region (29) and a p+-type monocrystal silicon region (30), (xii) growing a silicon oxide film (31) and forming accesses through said silicon oxide film for accessing said semiconductor elements, (xiii) depositing and etching aluminum electrodes (32) and (33) for interconnecting said first MOSFET, said diode, said second MOSFET, said resistor and said optoelectrical transducer array, whereby completing said semiconductor device.

2. A method for manufacturing a semiconductor device according to claim 1, wherein said heating is performed by the radiation of a laser or electron beam.

3. A method for manufacturing a semiconductor device according to claim 1, wherein said heating is performed by the use of a lamp or heater.

* * * * *